United States Patent
Wang et al.

(10) Patent No.: US 8,516,407 B1
(45) Date of Patent: Aug. 20, 2013

(54) METHODS FOR QUANTITATIVELY EVALUATING THE QUALITY OF DOUBLE PATTERNING TECHNOLOGY-COMPLIANT LAYOUTS

(75) Inventors: Lynn T. Wang, Fremont, CA (US); Sriram Madhavan, Santa Clara, CA (US); Luigi Capodieci, Santa Cruz, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/361,595

(22) Filed: Jan. 30, 2012

(51) Int. Cl.
*G06F 17/50* (2006.01)

(52) U.S. Cl.
USPC ............ 716/54; 716/50; 716/51; 716/52; 716/53; 716/55; 716/118; 716/119; 716/124; 716/125; 716/139; 430/5; 430/30

(58) Field of Classification Search
USPC ............ 716/50–55, 118–119, 124–125, 139; 430/5, 30
See application file for complete search history.

(56) References Cited

U.S. PATENT DOCUMENTS

| | | | |
|---|---|---|---|
| 7,673,278 B2 * | 3/2010 | Rathsack et al. | 716/56 |
| 8,239,806 B2 * | 8/2012 | Chen et al. | 716/126 |
| 8,261,214 B2 * | 9/2012 | Maeda et al. | 716/55 |
| 2009/0217224 A1 * | 8/2009 | Wiaux et al. | 716/5 |

OTHER PUBLICATIONS

Hsu et al., Template-Mask Design Methodology for Double Patterning Technology, 2010, IEEE, pp. 107-111.*
Inoue, Soichi, et al., "All-out Fight Against Yield Losses by Design-manufacturing Collaboration in Nano-lithography Era," pp. 395-401, ASP-DAC (2011).

* cited by examiner

*Primary Examiner* — Nghia Doan
(74) *Attorney, Agent, or Firm* — Ingrassia Fisher & Lorenz, P.C.

(57) ABSTRACT

A method for fabricating an integrated circuit is disclosed that includes, in accordance with an embodiment, providing a double patterning technology-compliant logical design for the integrated circuit, the logical design including a plurality of elements; scoring the design of one or more of the plurality of elements to produce a design score; modifying the design based at least in part on the design score; generating a mask set implementing the modified logical design; and employing the mask set to implement the logical design in and on a semiconductor substrate.

19 Claims, 8 Drawing Sheets

METHODS FOR QUANTITATIVELY EVALUATING THE QUALITY OF DOUBLE PATTERNING TECHNOLOGY-COMPLIANT LAYOUTS

TECHNICAL FIELD

The present invention generally relates to methods for fabricating an integrated circuit, and more particularly relates to methods that include scoring the quality of double patterning technology-compliant integrated circuit design layouts.

BACKGROUND

There is a continuing trend within the microelectronics industry to incorporate more circuitry having greater complexity on a single integrated circuit (IC) chip. Maintaining this trend generally entails shrinking the size of individual devices within the circuit by reducing the critical dimensions (CDs) of device elements along with the pitch, or the CD of such an element added to the spacing between elements. Microlithography tooling and processing techniques play an important role in resolving the features necessary to fabricate devices and accordingly, are continually under development to meet industry milestones relating to the CD and pitch characteristic of each new technology generation.

High numerical aperture (NA) projection stepper/scanner systems in combination with advanced photoresist processes now are capable of routinely resolving complex patterns that include isolated and dense resist features having CDs and pitches, respectively, well below the exposure wavelength. However, to meet the requirements of device design rules which continue to push the resolution limits of existing processes and tooling, other more specialized techniques have been developed to further enhance resolution. These include double patterning technology (DPT) techniques in which device patterns having potentially optically unresolvable features are decomposed into two or more complementary, and more easily resolvable patterns, each containing features with larger CDs and/or a relaxed pitch.

For traditional layout designs, multiple layout topologies exist per functionality. For DPT-compliant layout designs, in addition to multiple layout topologies, multiple DPT-compliant solutions exist per layout topology. Thus, two needs arise. First, DPT-compliant layouts generated for alternative layout topologies need to be systematically, automatically, and quickly evaluated for robustness to process variability. Secondly, guidance is needed for modifying DPT-compliant layouts such that their robustness to process variation can be opportunistically improved.

FIG. 1 depicts two exemplary DPT layouts (layouts "1" and "2"), which are intended to result in the same IC. Part 150 of FIG. 1 presents the original drawn layout and two alternative DPT-compliant solutions. Part 160 of FIG. 1 presents the corresponding printability simulations and shows that the DPT-compliant solution on the left (solution "1") is better than the one on the right (solution "2"), because solution "2" is vulnerable to pinches. A pinch, marked in FIG. 1 by the "X", is a point on the fabricated IC chip that is narrower than set forth in the design layout. The lack of an evaluation methodology can be a significant handicap when comparing the performance of alternative DPT-compliant solutions and competing decomposition algorithms.

Currently, the quality of DPT-compliant layouts is judged based on a binary pass/fail check, which provides a basic but incomplete evaluation. The decomposition algorithms are evaluated indirectly by comparing the results for a limited set of benchmark circuits. Since simulations are slow and computationally-expensive, a rule-based methodology is needed to systematically evaluate alternative DPT-compliant layout solutions such that guidance can be provided for layout optimizations.

BRIEF SUMMARY

Methods are provided for fabricating an integrated circuit. In accordance with one embodiment, a method includes providing a double patterning technology-compliant logical design for the integrated circuit, the logical design including a plurality of elements and scoring the design of one or more of the plurality of elements to produce a design score. Once the design has been scored, the method may further include modifying the design based at least in part on the design score. Once the design has been finalized, the method may include generating a mask set implementing the modified logical design and employing the mask set to implement the logical design in and on a semiconductor substrate.

In accordance with a further embodiment, a method is provided for fabricating an integrated circuit that includes identifying a double patterning technology-specific design element in a double patterning technology-compliant logical design for the integrated circuit, identifying a double patterning technology-specific metric applicable to the design element, and providing a score for the metric applicable to the design element. Once the metric has been scored, the method may further include redesigning the design element to improve the score for the metric. Furthermore, the method may include generating a mask set implementing the redesigned element and employing the mask set to implement the logical design in and on a semiconductor substrate.

In accordance with yet another embodiment, a method for preparing a double patterning technology-compliant integrated circuit design is provided that includes identifying at least one double patterning technology-specific design element of a plurality of design elements in the double patterning technology-compliant integrated circuit design and scoring the design of the identified at least one design elements based on a double patterning technology-specific metric to produce a design score. Once the design has been scored, the method may include determining whether the score of the design of the identified at least one design elements is above a threshold level, and, if the score is below the threshold level, redesigning the identified at least one design elements.

BRIEF DESCRIPTION OF THE DRAWINGS

The present invention will hereinafter be described in conjunction with the following drawing figures, wherein like numerals denote like elements, and wherein.

DETAILED DESCRIPTION

Figure 1:
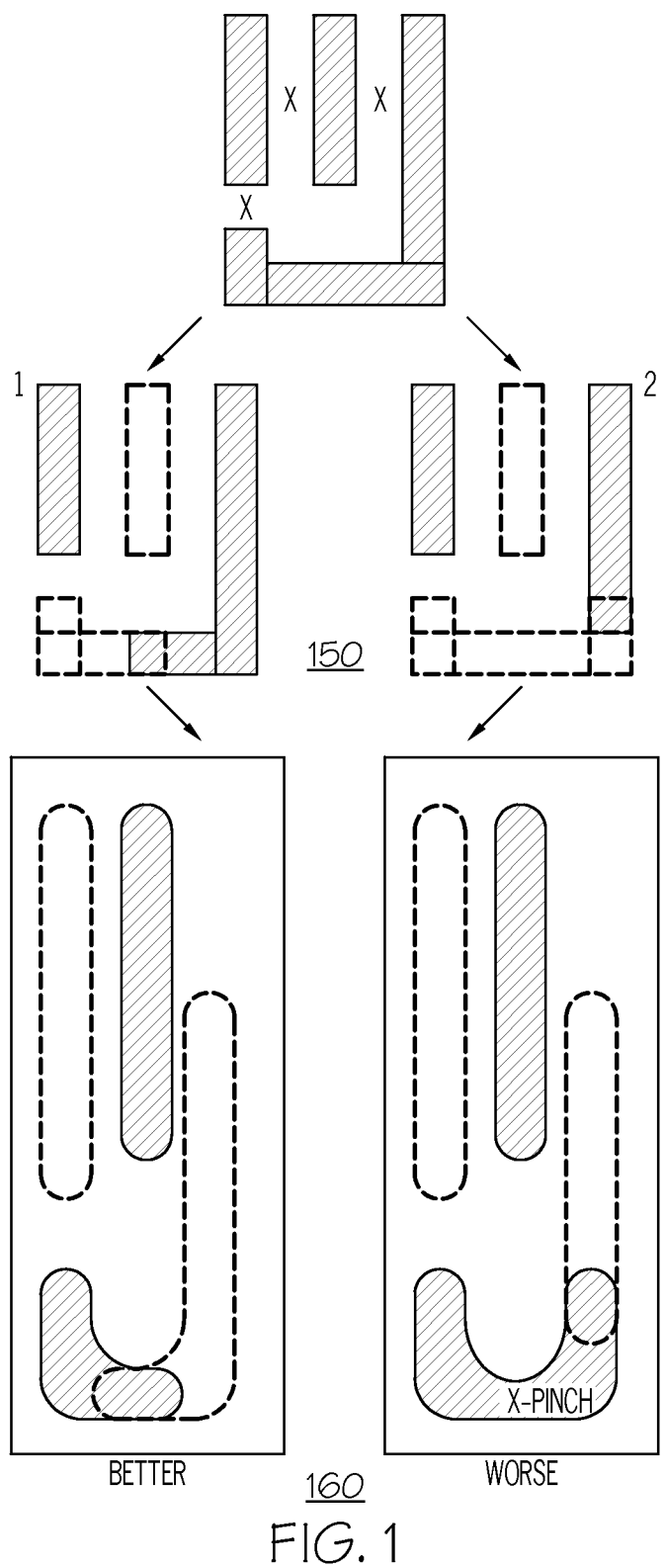
FIG. 1 depicts schematically a DPT layout design and a portion of an integrated circuit illustrating a DPT-compliant layout design comparison.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

This invention establishes methods for fabricating an integrated circuit wherein a methodology to systematically quantify the quality of double patterning technology (DPT)-compliant layout designs for an integrated circuit in order to, for example, evaluate and provide guidance for any opportunistic layout modifications such that manufacturability- and yield-related issues can be improved. A DPT-optimized scoring methodology is provided to systematically, automatically, and quickly quantify the quality of DPT-compliant layouts. The score is assigned based on the layout design's robustness to a set of DPT-specific metrics.

Table 1 provides several examples of DPT-specific metrics, including potential sources of variability in the fabricated IC chip and yield and electrical performance implications. While several examples are provided, those having ordinary skill in the art will understand and appreciate additional DPT-specific metrics, their associated sources of variability, and performance implications. As such, the following table is merely exemplary and not limiting.

TABLE 1

| DPT-Specific Metric | Sources of Variability | Yield and Electrical Performance Implications |
| --- | --- | --- |
| Spacing between oppositely colored features (critical area short for oppositely colored features) | Mask-to-mask misalignment | Additional capacitance and timing variability, functional failures (shorts) |
| Intra-mask density differences | Lithography, etch loading | Functional failures (opens and shorts), reliability, timing variability |
| Stitch enclosure | Mask-to-mask misalignment, patterning | Functional failures (opens) |
| Via/stitch enclosure | Mask-to-mask misalignment, patterning | Functional failures, resistance variability, reliability |
| Via/stitch keep-out | Mask-to-mask misalignment, patterning | Functional failures, resistance variability, reliability |
| Density of stitches | Mask-to-mask misalignment, patterning | Functional failures (opens), reliability (electro-migration), resistance variability |
| Focus-Sensitive Topologies | Lithography | Functional failures (opens and shorts), reliability |

Each DPT-specific metric is then described as a mathematical model that characterizes its process impact as a function of layout parameters, such as run length, line width, spacing, area, etc. Each of the listed DPT-specific metrics will now be discussed in detail with regard to their fabrication process implications, and also with regard to a scoring methodology to evaluate the robustness and suitability of the layout. In the examples below, various DPT-compliant design layout possibilities will be presented, some of which are labeled "better" and some of which are labeled "worse." It will be appreciated that the labels "better" and "worse" are merely intended to illustrate a relative comparison between the particular design possibilities present, and is not intended as a comment on the design suitability for fabrication purposes or as compared to the numerous other possible design layouts not shown.

Figure 2:
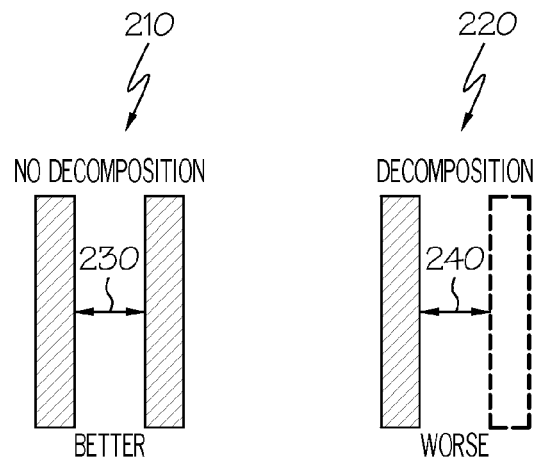
FIG. 2 depicts schematically a DPT layout design illustrating a spacing comparison.

In an embodiment, DPT-specific metrics may include the spacing between oppositely colored features. As a process implication, decomposing features from one mask layer to two mask layers introduces variability in the feature-to-feature spacing. This change in spacing causes vulnerability to critical area shorts as well as additional capacitance and timing variability. FIG. 2 depicts an exemplary layout design comparison showing this type of variability in feature spacing. As shown, part 210 thereof presents a one-color layout, in which the spacing 230, indicated by the double-headed arrows, between the two features is fixed. Part 220 shows that the assigning of features from one to two mask layers introduces a variable spacing 240, indicated by the double-headed arrows between the two oppositely colored features due to mask misalignment.

Figure 3:
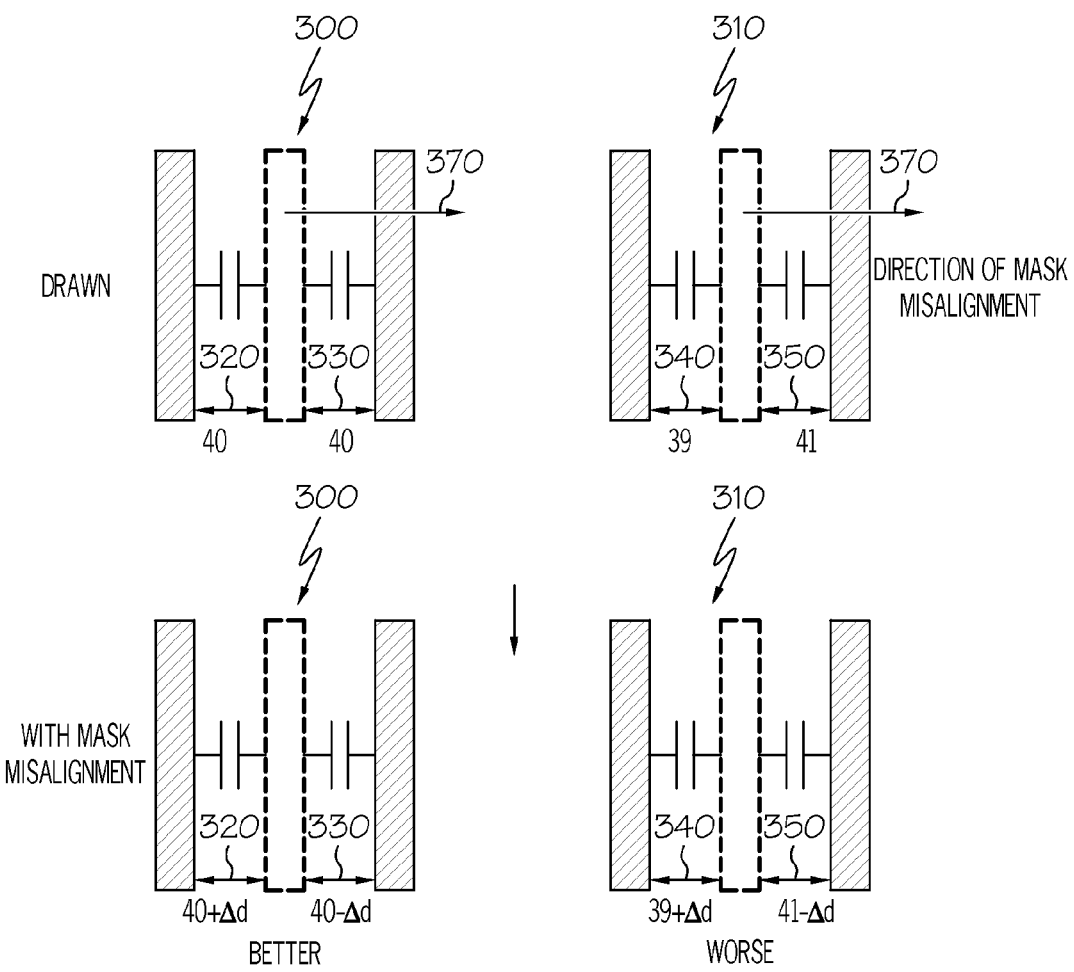
FIG. 3 depicts schematically a DPT layout design illustrating a change in capacitance comparison.

The presently disclosed scoring methodology may take into account spacing between oppositely colored features, wherein opposite coloring indicates a different mask. In one example, pairs of adjacent oppositely colored features are identified, as depicted in the exemplary layout design in FIG. 3. The spacing between pairs of lines, indicated by double-headed arrows 320, 330, 340, and 350, are then extracted. These parameters are used to model the sensitivity of the changes in capacitance with respect to distance. In part 300, spacing is shown as 40 and 40, whereas in part 310, spacing is shown as 39 and 41. Assuming that the features on the central mask is misaligned to the right (Δd; arrow 370 indicating direction), the spacings noted by 320 and 340 increase while the spacings noted by 330 and 350 decrease. This change corresponds to a capacitance decrease in part 320 and 340 and a capacitance increase in part 330 and 350, using a parallel plate capacitance model (i.e., capacitance is proportional to the inverse of spacing between two metal plates). Thus, it can be noted that the total change in capacitance caused by mask misalignment self-compensates. However, since the capacitances are not the same in magnitude for part 310, the total capacitance change is 2× greater than that of part 300. Compared to that of part 300, part 310 is therefore a "worse" design option in a relative sense.

In an embodiment, DPT-specific metrics may include intra-mask density differences. As a process implication, in DPT, many features are "colorless"—that is, features on one mask can be assigned to either of the two masks. However, assigning colorless features arbitrarily can cause density imbalances between the two masks. This imbalance leads to process non-uniformities caused by lithography and etch loading effects, which may translate to a greater critical dimension (CD) variability and a bigger process window. These effects cause functional failures (i.e., opens and shorts), reliability issues, and timing variability.

Figure 4:
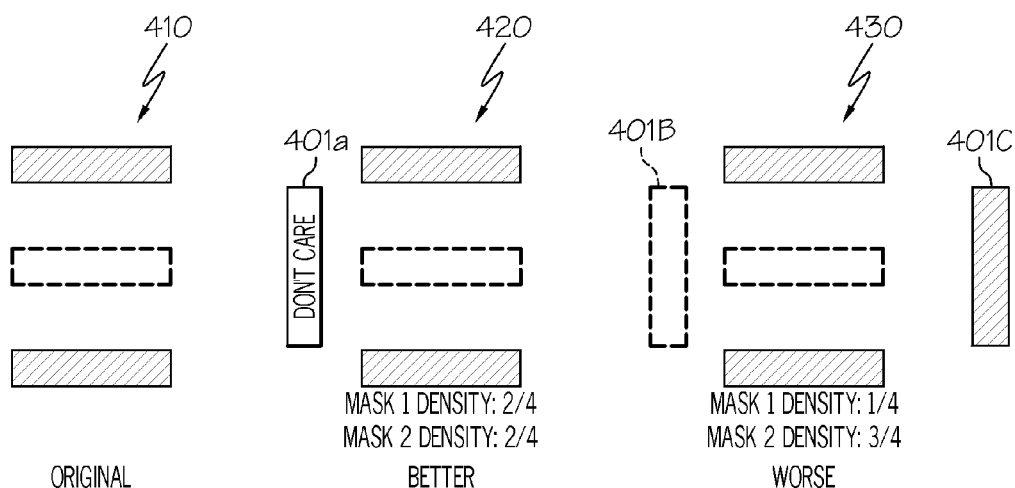
FIG. 4 depicts schematically a DPT layout design illustrating an intra-mask density comparison.

FIG. 4 depicts three different design layouts with intra-mask density differences. Part 410 of FIG. 4 presents a DPT-compliant solution containing a "colorless" feature 401a that can be assigned to either mask layers (labeled for simplicity as "Don't Care," meaning that the color of this feature could be either mask). The feature 401*b* in part 420 of FIG. 4 achieves a density balance between the two mask layers and is thus a better solution than feature 401*c* in part 430, and therefore part 420 has been labeled "better" to show the relative optimization between choices 420 and 430.

The presently disclosed scoring methodology may take into account intra-mask density differences. In one example, the density of each mask is first extracted. Scoring is then based on the differences between the two mask densities, and the optimum density difference is 0. For example, in FIG. 4, part 420, an optimum difference of 0 is achieved wherein Mask 1 Density and Mask 2 Density are both 2/4. In contrast, in part 430, the difference is non-zero, thus resulting in a less robust or relatively "worse" design layout.

In an embodiment, DPT-specific metrics may include stitch enclosures. As a process implication, mask-to-mask misalignment may cause functional failures (i.e., opens) in stitching areas. In addition, patterning effects such as lithography line-end pull backs may cause open circuits, as shown in the exemplary design layout of FIG. 5. As shown therein, two alternative DPT-compliant solutions for two layout topologies are presented. Mask misalignment in the direction indicated by arrow "Z" in part 520 can lead to functional failures (i.e., opens), whereas in part 510 such failure would be less likely.

Figure 5:
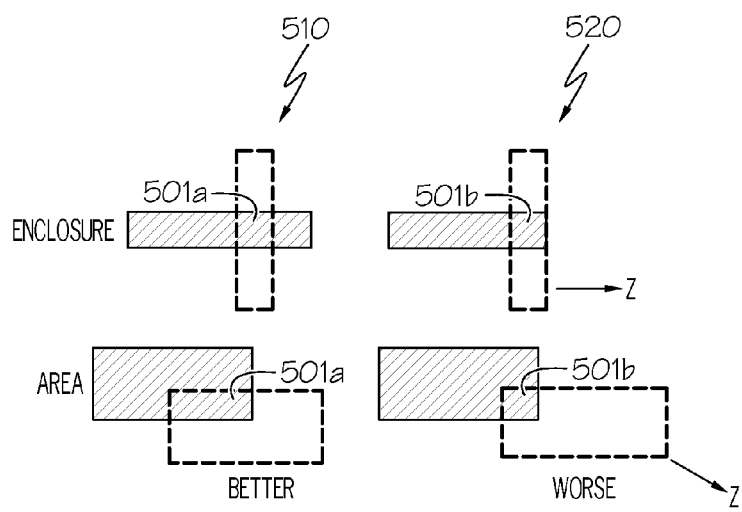
FIG. 5 depicts schematically a DPT layout design illustrating a stitch enclosure comparison.

The presently disclosed scoring methodology may take into account stitch enclosures. In one example, the stitching area is extracted and magnified. The overlapping region where the magnified stitching area and the original drawn area is extracted. The larger the extracted overlapping area, the higher is the score. As shown in FIG. 5, the "better" part 510 has greater overlap area 501*a* than the "worse" part 520 (overlap area 501*b*).

Figure 6:
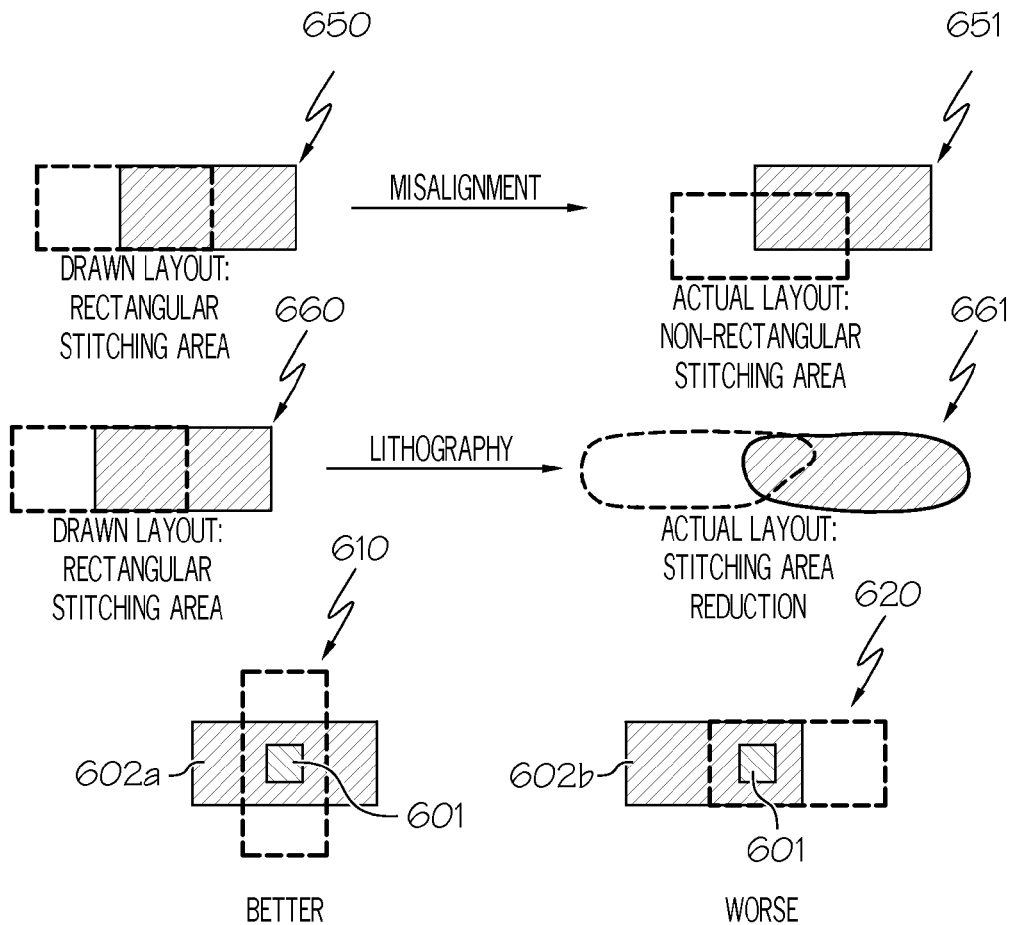
FIG. 6 depicts schematically a DPT layout design illustrating a via/stitch enclosure comparison.

In an embodiment, DPT-specific metrics may include via/stitch enclosures. As a process implication, mask-to-mask misalignment and patterning issues may produce nonrectangular stitching areas, illustrated by the misaligned actual layout 651 as compared to the drawn layout 650, and stitching area reductions, illustrated by the reduced actual layout 661 as compared to the drawn layout 660, as shown in FIG. 6. Further, stitching areas are indicated at 602*a*, 602*b*, and these vulnerabilities are exacerbated when a via 601 is present in the stitching area since the via 601 itself also has an inherent misalignment error. Thus, functional failures, resistance variability, and reliability issues may occur since there may not be enough landing area for a via to be etched through to the lower metal layers. With continued reference to FIG. 6, part 610 thereof presents a relatively "better" layout topology than part 620 because part 610 is robust to misalignment in the up-down and left-right directions, while part 620 is only robust in the left-right directions.

The presently disclosed scoring methodology may take into account via/stitch enclosures. For example, a similar scoring model described above with regard to the stitch enclosures can be used.

Figure 7:
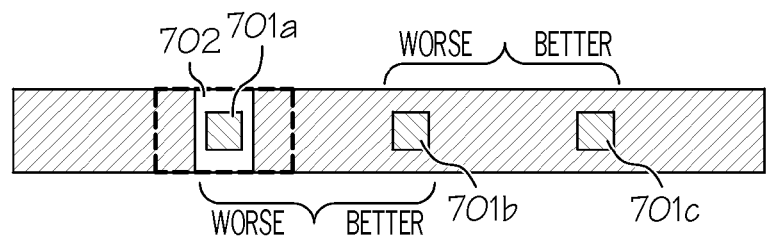
FIG. 7 depicts schematically a DPT layout design illustrating a via/stitch keep-out comparison.

A further DPT-specific metric suitable for use in the present scoring methodology may include via/stitch keepouts. As a process implication, to avoid the process issues described above with regard to via/stitch enclosures, it is generally appreciated by those having ordinary skill in the art that the vias should be kept outside of the stitching area whenever possible. As shown in FIG. 7, having the vias 701*b,c* outside of the stitching area 702 is more robust to process variability than the via within the stitching area 701*a*. The via 701*c*, farther away from the stitching area, is less vulnerable to process variation than the via 701*b* closer to the stitching area.

The presently disclosed scoring methodology may take into account via/stitch keepouts. For example, the distance from the via to the stitching area is extracted and normalized to the minimum design rule value. The larger the ratio, the more robust the via is to process variability. As a result, the vias within the stitching area have lower scores than those outside of the stitching area.

Figure 8:
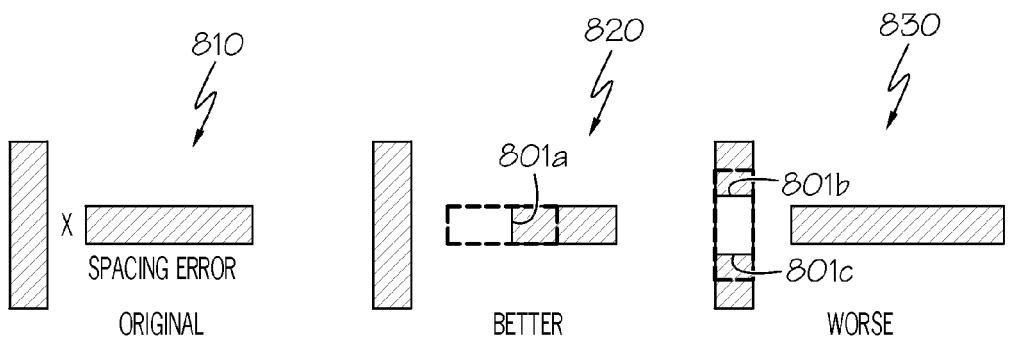
FIG. 8 depicts schematically a DPT layout design illustrating a cut/stitch density comparison.

In an embodiment, DPT-specific metrics may include the density of cuts-and-stitches. As a process implication, each stitching point is a process weak point. Thus, it is best to minimize the number of stitches whenever possible. As shown in FIG. 8, part 810 thereof presents the original drawn layout that needs to be decomposed due to a spacing error "X". Part 820 presents a relatively "better" DPT-compliant solution than 830 because it uses one less cut-and-stitch (cut-and-stitch 801*a* is present in part 820, while cuts-and-stitches 801*b,c* are present in part 830). While it will be appreciated that both exemplary decompositions, parts 820 and 830 of FIG. 8, solve the spacing problem noted in part 810 thereof, the DPT-compliant layout design of part 820 is relatively better than part 830 because it includes one fewer cut-and-stitch, and is therefore only half as prone to process failure.

The presently disclosed scoring methodology may take into account the density of cuts-and-stitches. In one example, the number of stitches is normalized to the area of the cell. While the optimum ratio is 0, for example, 0 cuts-and-stitches per cell area, layouts with fewer cuts-and-stitches per cell area will receive a better score. In FIG. 8, for example, part 820 would receive a better score than part 830 because it only has one cut-and-stitch per cell area, as compared to the two cuts-and-stitches found in part 830.

In an embodiment, DPT-specific metrics may include focus-sensitive topologies. As a process implication, special layout topologies that exacerbate lithography focus variation such as U-shapes, H-shapes, dog-bone-shapes, and other such shapes that will be known to those of ordinary skill in the art can cause functional failures (i.e., pinching and bridging) as well as reliability issues.

The presently disclosed scoring methodology may take into account focus-sensitive topologies. For example, focus-sensitive layout topologies can be pre-characterized through systematic testing. Then, rule-based checks are used to identify and extract these special topologies. The number of special topologies is then normalized to the area of the cell. While the optimum ratio is 0 focus-sensitive topologies per cell area, designs with relatively fewer focus-sensitive topologies will receive a better score than those with relatively greater focus-sensitive topologies.

Various DPT-specific metrics, their process implications, and exemplary scoring methodologies have now been described. In an embodiment, the cumulative impact that includes the contribution from all individual metrics may be abstracted to a composite score. The composite score is important because the projected overall yield and electrical performance are determined by the impact of all process implications combined. Thus, a composite scoring methodology is needed such that one score can be used to compare competing designs and also to predict the overall yield of a DPT-compliant layout design.

Figure 9:
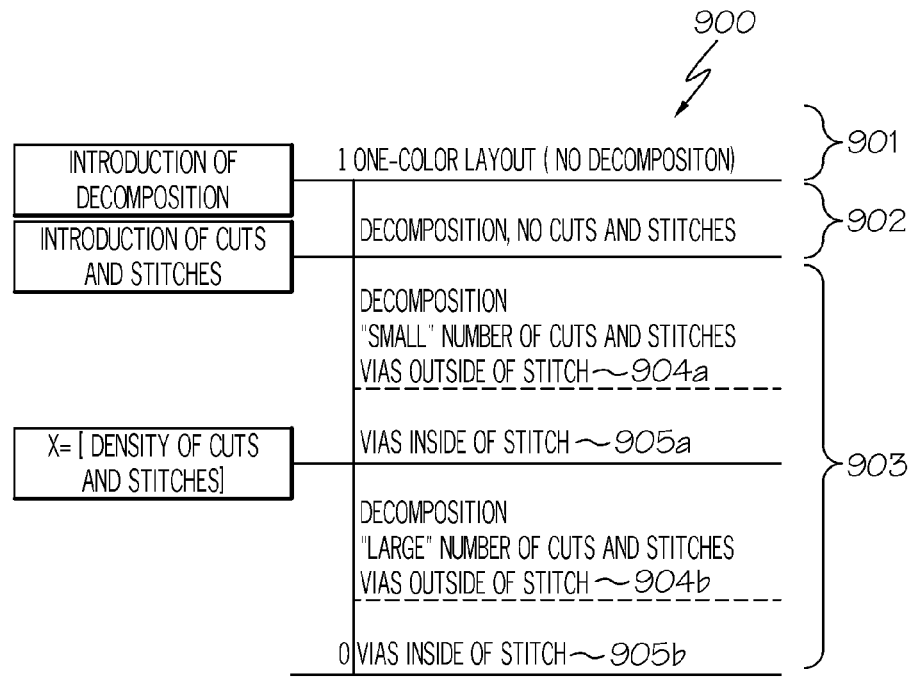
FIG. 9 depicts a DPT-configured scoring methodology.

In one example, the presently disclosed methodology abstracts the DPT-specific scores to a composite scoring scale of, e.g., 0 to 1 such that 1 is the optimum. As shown in FIG. 9, an exemplary grading scale 900 ranks DPT-compliant solutions in the following categories: one-color layouts 901, two-color layouts with no cuts-and-stitches 902, and two-color layouts with cuts-and-stitches 903. The score decreases with the increasing density of cuts-and-stitches. The DPT-compliant solutions containing vias that lie outside of the stitching area 904$a,b$ receive higher scores than that of vias within the stitching area 905$a,b$. Other like scoring methodologies using other, more, or fewer metrics may easily be conceived from this example.

The ranking of the DPT-metrics scores to be abstracted to the composite scoring scale described above may be prioritized and modeled mathematically as weighting factors. The prioritization of each metric can determined by the foundry, for example, based on process information, and conveyed to the layout designers as a weighting factor. That is, the foundry can select the value of the weighting factor for each metric based on the process-specific considerations and prior experience. Alternatively, the layout designers can select the value of the weighting factor, based on design considerations. The metrics with higher weighting factors are more important to the overall yield. As such, it may be desirable for layout designers that the higher-weighted factors are optimized first. If optimizing one metric degrades another, a tradeoff analysis can be performed such that the layout modifications which generate the highest composite score is found.

A composite score can be computed using various methods. The composite scores shown in FIG. 10, for example, were computed using a Poisson yield model. In this composite scoring methodology, the follow assumptions are made: For each metric, a function $\lambda$ is first defined to characterize the process impact of a DPT-metric as a function of layout parameters. Using the Poisson model, $\lambda$ is mapped to a scoring scale from 0-1, Y. The composite score assumes that each metric describes an independent event and is thus computed by taking the product of all Y.

Figure 10:
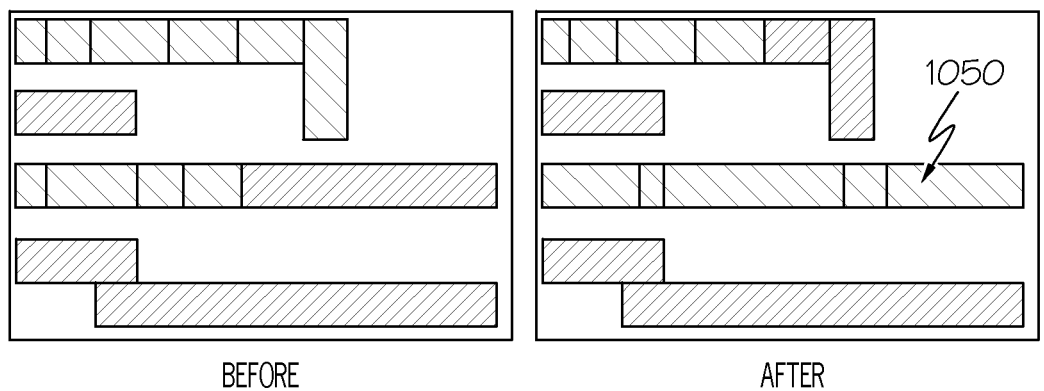
FIG. 10 each depict a comparison between two DPT-compliant layout topologies.

FIG. 10 shows an additional example of composite score-based layout design optimization. As shown in FIG. 10, the scoring methodology can be used to guide designers so that they can improve their layout design's manufacturability. The layout on the left ("Before") shows a low score (0.68) in the density balance category. After modifications, the score for the density balance increased to 0.82. In the "After" design shown in FIG. 10, the score was improved primarily by the increase in the density balance increase, as the other metrics achieve similar score in both the "before" and "after" layout. The density balance score was improved due to the use of an oppositely colored mask in the portion indicated by arrow 1050. The optimum score in this example, as in the above examples, is 1. As such, the presently described scoring methodology can be used to identify areas in the design that can be improved, and thereafter the design may opt to redesign the layout to achieve a higher score.

Figure 11:
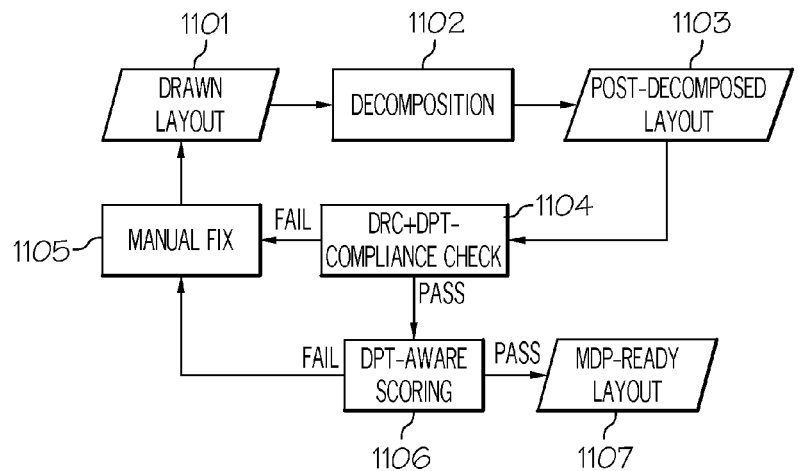
FIG. 11 is a flow diagram illustrating a method for scoring DPT-compliant layout designs.

With reference now to FIG. 11, this rule-based scoring methodology can be easily integrated in the DPT-compliant design flow. At step 1101, a layout is drawn. Thereafter, it is decomposed at step 1102, and a post-decomposed layout (1103) is checked for DRC and DPT compliance at step 1104. Once a layout design passes both DRC and DPT-compliant checks, it is assigned a composite score, for example using the Poisson model scoring methodology as described above, at step 1106. If its composite score passes a pre-determined threshold value provided by the foundry or other interested entity, the layout design would be ready for Mask Data Preparation (MDP) in step 1107. If its composite score falls below the threshold, the layout would be modified until the score passes the threshold value, using the manual fix step 1105.

In an embodiment, the modeling of a metric that relates to density, enclosure, and focus sensitivity can be calibrated by the designing of parameter-specific test structures and simulating them with a lithography simulator that has been calibrated with silicon data. The metric's relative impact or importance to the design layout (i.e., weighting factor), in one example, can be determined by measuring and comparing the changes in the process-variation band thickness for these test structures, in an iterative process. In this manner, the value of the weighting factor can be selected based on empirical process results. In order to capture other process-induced effects, these test structures are fabricated and measured. The measured results are then used to calibrate the DPT-specific models and the composite scoring methodology. An appropriate "threshold" value is determined by examining the test structures' yield. In the alternative, weighting factors can be chosen based on subjective factors in the discretion of the designer. Once calibrated, such scoring methodology can be used to quickly and economically predict DPT-induced layout-dependent issues without running slow computationally-expensive process simulations and/or taping out a test chip.

Figure 12:
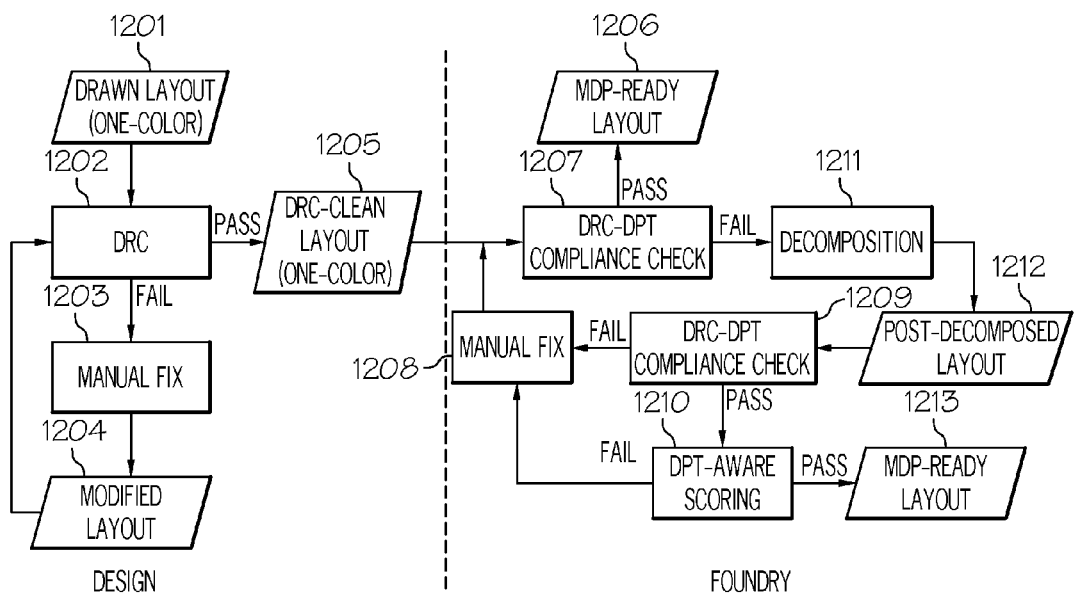
FIG. 12 is a flow diagram illustrating an alternative method for scoring DPT-compliant layout designs.

In another embodiment, the DPT-aware scoring methodology can also be applied to "transparent" DPT-compliant design flows, as shown in FIG. 12. The designers follow the traditional design flow (steps 1201 through 1205) and deliver a DRC-clean layout to the foundry. The foundry can use the proposed scoring methodology to generate a DPT-compliant solution for Mask Data Preparation (MDP), as shown in steps 1206 through 1213, in a manner similar to that described above with regard to FIG. 11. As such, the compliance checks are separated between the design stage and the fabrication stage, where the designers are responsible for ensuring DRC compliance while the foundry is responsible for ensuring DPT-compliance, as needed.

Figure 13:
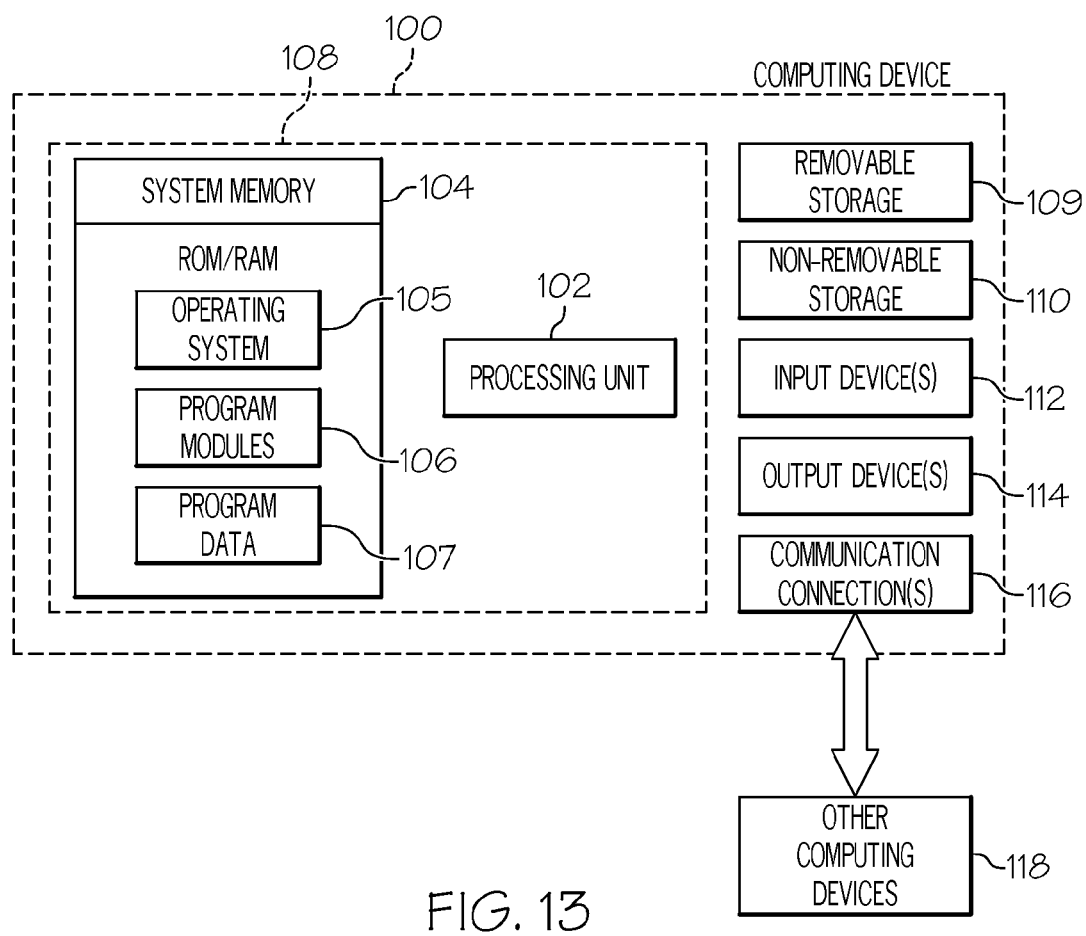
FIG. 13 is a functional block diagram that illustrates a computing device that may be used in implementations of the present invention.

The embodiments described herein can be implemented on a computing system. FIG. 13 is a functional block diagram that illustrates a computing device that may be used in implementations of the present invention. FIG. 13 illustrates an exemplary computing device that may be used in illustrative implementations of the present invention. With reference to FIG. 13, in a very basic configuration, computing device 100 typically includes at least one processing unit 102 and system memory 104. Depending on the exact configuration and type of computing device 100, system memory 104 may be volatile (such as RAM), non-volatile (such as ROM, flash memory, etc.) or some combination of the two. System memory 104 typically includes an operating system 105, one or more program modules 106, and may include program data 107. This basic configuration is illustrated in FIG. 13 by those components within dashed line 108

Computing device 100 may have additional features or functionality. For example, computing device 100 may also include additional data storage devices (removable and/or non-removable) such as, for example, magnetic disks, optical disks, or tape. Such additional storage is illustrated in FIG. 13 by removable storage 109 and non-removable storage 110. Computer storage media may include volatile and nonvolatile, removable and non-removable media implemented in any method or technology for storage of information, such as computer readable instructions, data structures, program modules, or other data. System memory 104, removable storage 109 and non-removable storage 110 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 100. Any such computer storage media may be part of device 100. Computing device 100 may also have input device(s) 112 such as keyboard, mouse, pen, voice input device, touch input device, etc. Output device(s) 114 such as a display, speakers, printer, etc. may also be included. These devices are well known in the art and need not be discussed at length here.

Computing device 100 may also contain communication connections 116 that allow the device 100 to communicate with other computing devices 118, such as over a network. Communication connections 116 are one example of communication media. Communication media may typically be embodied by computer readable instructions, data structures, program modules, or other data in a modulated data signal, such as a carrier wave or other transport mechanism, and includes any information delivery media. The term computer readable media as used herein includes both storage media and communication media.

Embodiments of the present disclosure can be used to design logical IC chips capable of being fabricated using processes and apparatus known in the art. For example, once a layout design has been scored and/or redesigned and finalized according to the methodology described above, the fabrication process can be accomplished by employing the mask set to fabricate the semiconductor device by implementing the logical design in and on a semiconductor substrate.

The presently disclosed embodiments will be appreciated to establish a methodology to quantitatively, systematically, automatically, and quickly evaluate the quality of DPT-compliant layout designs. Furthermore, the presently disclosed embodiments will be appreciated to improve the manufacturability and yield of DPT-compliant layout designs by providing guidance for opportunistic layout modifications.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method for fabricating an integrated circuit comprising the steps of:
providing a double patterning technology-compliant logical design for the integrated circuit, the logical design including a plurality of design elements;
evaluating the plurality of design elements for the presence of each of the following design features: (1) oppositely colored features, (2) intra-mask density differences, (3) stitch enclosures, (4) via/stitch enclosures, (5) via/stitch keepouts, and (6) focus-sensitive topologies, wherein at least three of the design features (1) through (6) are present in the plurality of design elements;
scoring the logical design of the plurality of design elements to produce a design score, wherein the design score comprises a composite of individual scores for each of the at least three of the design features (1) through (6) that are present, wherein: (1) an individual oppositely colored features score comprises a numerical score representing a spacing between the oppositely colored features, (2) an individual intra-mask density differences score comprises a numerical score representing a density balance among mask layers of the logical design, (3) an individual stitch enclosures score comprises a numerical score representing an overlap area of the stitch enclosures, (4) an individual via/stitch enclosures score comprises a numerical score representing an overlap area of the via/stitch enclosures, (5) an individual via stitch keepouts score comprises a numerical score representing a distance from a via to a stitching area of the via stitch keepouts, and (6) an individual focus-sensitive topologies score comprises a numerical score representing a total number of focus-sensitive topologies;
modifying the design based at least in part on the design score, wherein modifying the design comprises altering at least one of the plurality of design elements such that an individual score for each of the at least three of the design features (1) through (6) with regard the at least one design element is increased, thereby increasing the composite of individual scores;
generating a mask set implementing the modified logical design; and
employing the mask set to fabricate the logical design in and on a semiconductor substrate.

2. The method of claim 1, wherein the individual oppositely colored features score comprises a numerical evaluation of a spacing distance between pairs of oppositely colored design features, a common run length of the pairs of oppositely colored design features, and a line width of the pairs of oppositely colored design features.

3. The method of claim 2, wherein the individual intra-mask density differences score comprises a numerical evaluation of an intra-mask density difference of an area occupied by features of a first mask and an area occupied by features of a second mask.

4. The method of claim 3, wherein the individual stitch enclosures score comprises a numerical evaluation of an area of overlap between features of a first mask and features of a second mask in a stitch enclosure region.

5. The method of claim 4, wherein the individual via/stitch enclosures score comprises a numerical evaluation of an area of overlap between features of a first mask and features of a second mask in a via/stitch enclosure region.

6. The method of claim 5, wherein the individual via-stitch keep-outs score comprises a numerical score representing a normalized ratio of the distance from the via to the stitching area of the via stitch keepouts.

7. The method of claim 6, wherein the individual focus-sensitive topologies score comprises a numerical score representing the total number of focus-sensitive topologies per area of the logical design.

8. The method of claim 1, further comprising calculating the composite of individual scores for each of the at least three of the design features (1) through (6) that are present.

9. The method of claim 8, wherein calculating the composite of individual scores comprises applying a Poisson model.

10. The method of claim 1, wherein the design score is further based on an individual density of cuts-and-stitches score that comprises a numerical score representing a density of stitches per unit area of the logical design.

11. The method of claim 1, further comprising subjecting the double patterning technology-compliant logical design to a double patterning technology compliance check algorithm prior to evaluating the plurality of design elements.

12. A method for fabricating an integrated circuit comprising the steps of:

identifying a double patterning technology-specific design element in a double patterning technology-compliant logical design for the integrated circuit;

identifying at least three double patterning technology-specific metrics applicable to the design element, wherein the at least three double patterning technology-specific metrics are selected from the group consisting of: (1) an individual oppositely colored features score comprising a numerical score representing a spacing between the oppositely colored features, (2) an individual intra-mask density differences score comprising a numerical score representing a density balance among mask layers of the logical design, (3) an individual stitch enclosures score comprising a numerical score representing an overlap area of the stitch enclosures, (4) an individual via/stitch enclosures score comprising a numerical score representing an overlap area of the via/stitch enclosures, (5) an individual via stitch keepouts score comprising a numerical score representing a distance from a via to a stitching area of the via stitch keepouts, and (6) an individual focus-sensitive topologies score comprising a numerical score representing a total number of focus-sensitive topologies;

providing a score for each of the at least three metrics applicable to the design element;

redesigning the design element to improve the score for the at least three metrics, wherein redesigning the design element comprises altering the at least three identified double patterning technology-specific metrics such that an individual score for each of the at least three identified double patterning technology-specific metrics are increased;

generating a mask set implementing the redesigned element; and employing the mask set to fabricate the logical design in and on a semiconductor substrate.

13. The method of claim 12, wherein the score for each of the at least three metrics comprises part of a composite score.

14. The method of claim 13, wherein a weighting factor is associated with the score for the metric.

15. The method of claim 14, wherein the weighting factor is selected based at least in part on a relative importance of the metric to the logical design.

16. The method of claim 14, wherein the weighting factor is selected based at least in part on empirical testing of logical designs.

17. The method of claim 14, wherein each of the at least three double patterning technology-specific metrics applicable to the design element is identified based at least in part on the weighting factor.

18. A method for preparing a double patterning technology-compliant integrated circuit design comprising the steps of:

identifying at least two double patterning technology-specific design elements of a plurality of design elements in the double patterning technology-compliant integrated circuit design, wherein the at least two double patterning technology-specific design elements comprise oppositely colored features and intra-mask density differences;

scoring the design of the identified at least two design elements based on a double patterning technology-specific metric to produce a design score, wherein the design score comprises a composite of an individual oppositely colored features score comprising a numerical score representing a spacing between the oppositely colored features and an individual intra-mask density differences score comprising a numerical score representing a density balance among mask layers of the logical design;

determining whether the design score of the design of the identified at least two design elements is above a threshold level; and redesigning the identified at least two design elements when the score is below the threshold level, wherein the double patterning technology-compliant integrated circuit design generates a mask set to fabricate the logical design in and on a semiconductor substrate.

19. The method of claim 18, wherein scoring the design of the identified at least two double patterning technology-specific design elements is based at least in part on a relative importance of the double patterning technology-specific metric.

* * * * *